US009142634B2

(12) United States Patent
Jozwiak et al.

(10) Patent No.: US 9,142,634 B2
(45) Date of Patent: Sep. 22, 2015

(54) VERSATILE SPIN-POLARIZED ELECTRON SOURCE

(71) Applicants: Chris Jozwiak, Oakland, CA (US);
Cheol-Hwan Park, Seoul (KR);
Kenneth Gotlieb, Berkeley, CA (US);
Steven G Louie, Berkeley, CA (US);
Zahid Hussain, Orinda, CA (US);
Alessandra Lanzara, Piedmont, CA (US)

(72) Inventors: Chris Jozwiak, Oakland, CA (US);
Cheol-Hwan Park, Seoul (KR);
Kenneth Gotlieb, Berkeley, CA (US);
Steven G Louie, Berkeley, CA (US);
Zahid Hussain, Orinda, CA (US);
Alessandra Lanzara, Piedmont, CA (US)

( * ) Notice: Subject to any disclaimer, the term of this patent is extended or adjusted under 35 U.S.C. 154(b) by 0 days.

(21) Appl. No.: 14/185,651

(22) Filed: Feb. 20, 2014

(65) Prior Publication Data

US 2015/0235799 A1    Aug. 20, 2015

(51) Int. Cl.
*H01L 21/00*        (2006.01)
*H01L 29/66*        (2006.01)

(52) U.S. Cl.
CPC .... *H01L 29/66007* (2013.01); *H01L 29/66984* (2013.01)

(58) Field of Classification Search
CPC ................... H01L 29/66007; H01L 29/66984
See application file for complete search history.

(56) References Cited

U.S. PATENT DOCUMENTS

2008/0073554 A1 *   3/2008  Duan et al. ................. 250/423 F
2011/0089397 A1 *   4/2011  Ujihara et al. ................. 257/11

* cited by examiner

*Primary Examiner* — Long Pham
(74) *Attorney, Agent, or Firm* — John Cravero; Brian Lally; John Lucas

(57) ABSTRACT

One or more embodiments relate generally to the field of photoelectron spin and, more specifically, to a method and system for creating a controllable spin-polarized electron source. One preferred embodiment of the invention generally comprises: method for creating a controllable spin-polarized electron source comprising the following steps: providing one or more materials, the one or more materials having at least one surface and a material layer adjacent to said surface, wherein said surface comprises highly spin-polarized surface electrons, wherein the direction and spin of the surface electrons are locked together; providing at least one incident light capable of stimulating photoemission of said surface electrons; wherein the photon polarization of said incident light is tunable; and inducing photoemission of the surface electron states.

25 Claims, 7 Drawing Sheets

VERSATILE SPIN-POLARIZED ELECTRON SOURCE

GOVERNMENT RIGHTS

The United States Government has rights in this invention pursuant to DOE Contract No. DE-AC02-05CH11231 between the U.S. Department of Energy and the University of California, as operator of Lawrence Berkeley National Laboratory.

FIELD OF THE INVENTION

The present invention relates to photoelectron spin.

BACKGROUND

Three-dimensional topological insulators constitute examples of symmetry protected topological states in the absence of applied magnetic fields and cryogenic temperatures. A token characteristic of these non-magnetic bulk insulators is the protected electronic states located on the materials' surfaces. The topological electronic bandstructure of a bulk topological insulator ensures the presence of gapless surface electronic states with Dirac-like dispersions similar to graphine. Jozwiak, C. et al. Photoelectron spin-flipping and texture manipulation in a topological insulator. *Nature Physics* 9, 293-298 (2013): which is hereby incorporated by reference in its entirety including the supplemental information. However, unlike graphene, electrons in the topological surface states are spin polarized with their spins regulated by their direction of travel resulting in a helical spin texture in momentum space. Hsieh, D, et al. A tunable topological insulator in the spin helical Dirac transport regime. *Nature* 460, 1101-1105 (2009); which is hereby incorporated by reference in its entirety. Each momentum state in a topological insulator can only host one surface electron, and since its spin is regulated by its momentum, it results in the helical spin texture. Xue, Q-K. Full spin ahead for photoelectrons, *Nature Physics* 9, 265-266 (2013); which is hereby incorporated by reference in its entirety.

A current method of generating an electron source is through the use of traditional photocathodes, where the photocathode is illuminated by light and electrons are ejected through the photoelectric effect. This is a popular method as short electron bunches are easy to create from photocathodes. However, for a spin-polarized electron source, the most popular technique is using the optical orientation effect in GaAs photocathodes. This includes a laser beam illuminating a GaAs wafer to eject a spin polarized electron beam. The polarization of the light controls the spin polarization of the electron beam: right circularly polarized light creates a spin-up polarized electron beam, and a left circularly polarized beam creates a spin-down beam.

This current method of GaAs photocathodes is imperfect. The laser beam must be a particular photon energy that closely matches the energy gap in GaAs, or else the spin polarization will be low. Also, the photon energy is too low to overcome the work function of GaAs and will not eject electrons from the surface of GaAs. Therefore, the surface must have a careful atomic layer of Cs and $O_2$ applied to the surface creating a dipole layer, reducing the work function allowing for sufficient photoemission at such low photon energy levels. If this layer is produced incorrectly, very few electrons will be ejected, creating a low intensity electron source.

The production of this layer is difficult and tedious. First, the GaAs is often chemically etched and then quickly placed into an ultra-high vacuum. The GaAs surface must be cleaned in the vacuum by heating to temperatures around 550° C.; too low of a temperature and the surface will not be clean enough while too high of a temperature and the As evaporates ruining the wafer. After the GaAs surface is cleaned in the vacuum, the Cs must be deposited in-situ, followed by the correct $O_2$ exposure. This tediously prepared surface must be kept in extreme vacuum conditions and deteriorates within several days at 1×10−11 torr.

Another issue with the layering for the GaAs photocathode method is that the spin-polarization is low. For a plain GaAs wafer with the perfect laser photon energy, the theoretical maximum: polarization is around 50%, and actual yield is closer to 25-30%. The theoretical maximum can be increased to 100% if highly specialized wafers are used in which the GaAs is artificially strained through the growth of superlattice wafers which forces the GaAs to take on a different crystalline shape. These highly specialized wafers have been shown to yield 90% polarization; however, these are much more expensive, difficult to work with, and give inconsistent results.

A third issue with the layering of the GaAs photocathode method is that the resulting spin-polarization is locked along the axis of the laser beam. This means that the spin polarization can only be made "up" or "down" perpendicular to the GaAs or longitudinally to the beam's direction of propagation. This requires electrostatic optics that can steer the electron beam's direction without affecting the spin orientation. Magnetic elements can also be introduced to further manipulate the spin orientation, but these electrostatic optics and magnetic elements all add up to further complications, added errors, and higher costs.

BRIEF SUMMARY

The present invention relates to controllable spin-polarized electron sources and methods for creating controllable spin-polarized electron sources. One embodiment of the invention generally comprises the following steps: (1) providing a crystal having an insulating interior and protected metallic electronic states confined to the material's surfaces wherein the surface state electrons are spin polarized with their spins determined by the direction of their travel; (2) creating photoemission on the surface state electrons by use of an incident light which has fully tunable photon polarizations.

Another embodiment of the invention generally comprises a material containing an interior that is an insulator with surfaces that contain metallic electronic states that are spin polarized with their spins locked perpendicular to their momentum along with a source of polarized incident light that is able to fully control the resulting photoelectrons in all three dimensions.

The ability to shine polarized light on a topological insulator and excite spin-polarization-tailored electrons has potential for the field of spintronics, electronics that exploit spin as well as charge. Devices that optically control electron distribution and flow would constitute a significant advance, allowing more versatile and efficient high-tech gadgets to be created. A more immediate utility of an easily controlled spin-polanized electron source is the application of a high quality photocathode source. This photocathode source could be available for many applications that require electron beams with specific spin polarization, as the embodiments of the present invention allow for spin-polarization of electrons to be precisely and conveniently controlled in three dimensions.

The multiple embodiments of the present invention described herein have many advantages, including but not limited to those described above. However, the invention does not require that all advantages and aspects be incorporated into every embodiment of the present invention.

BRIEF DESCRIPTION OF THE DRAWINGS

These and other features, aspects, and advantages of the present invention will become better understood with reference to the following description, appended claims, and accompanied drawings where:

DETAILED DESCRIPTION

Figure 1:
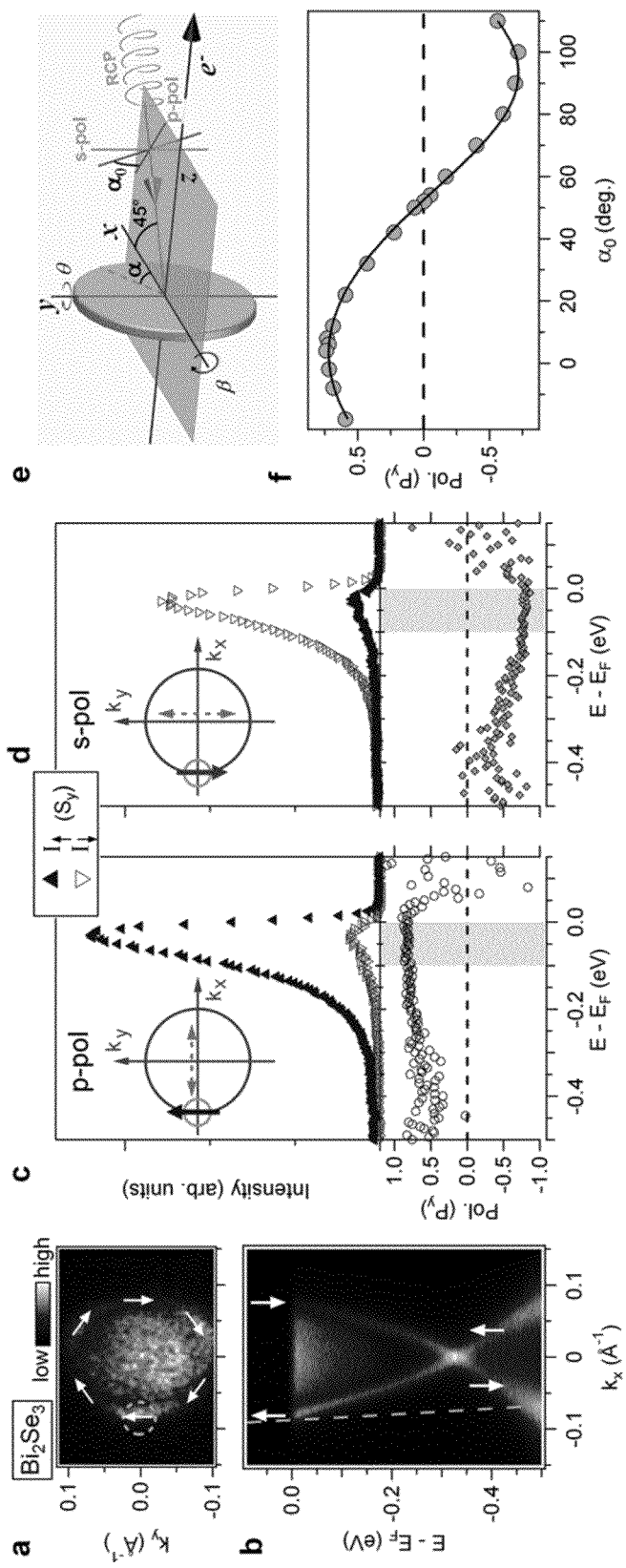
FIG. 1 The dependence of photoelectron spin on linear photon polarization observed in a topological insulator.

One or more embodiments relates to controllable spin-polarized electron sources and methods for creating controllable spin-polarized electron sources. More specifically, one or more embodiments relates to methods of creating a controllable spin-polarized electron source in which photoemission is created on the surface of one or more materials that has surface electron states that are spin-polarized and wherein the spins are locked perpendicular to their momentum.

Materials

One preferred embodiment of the invented method of creating a controllable spin-polarized electron source comprises the following steps: (1) providing a material with at least one surface and this surface having electronic states wherein the surface state electrons are spin polarized with their spins determined by the direction of their travel; (2) providing incident light with fully tunable photon polarizations that is also capable of stimulating photoemission of the surface electrons; (3) creating photoemission on the surface state electrons by use of an incident light which has fully tunable photon polarizations.

Materials that can be used in one or more embodiments have certain properties.

These properties include a material with at least one planar or nearly planar surface and this surface contains conducting states in that electrons can move along the surface. However, the direction and spin of these surface electrons are locked together, so that the surface electrons are oriented parallel to the surface plane and are perpendicular to their direction of travel, resulting in a helical spin texture in momentum space. Any material having these qualities is available for use in one or more embodiments. One exemplary group of materials having these properties are the materials considered to be "topological insulators."

In a preferred embodiment, the material to be provided is a topological insulator, wherein there are surfaces with spin-polarized electrons and an interior that acts as an insulator. Further, the material provided can be chosen from the group of topological insulators, including, but not limited to, bismuth antimonide, antimony, bismuth selenide, bismuth telluride, antimony telluride, samarium hexaboride, and stanene.

In another embodiment, the material provided has surfaces with spin-polarized electrons and a bulk material interior that is n-doped, meaning it has electron carriers in the bulk conduction band.

Light Source

Any energy light source can be used as long as the photon energy of the light source is higher than the work function of the material. Most materials have a work function in the range from ~4 to ~5 eV; therefore, depending on the material, any light source that has a photon energy above ~5 eV can be used to induce photoemission. There does not appear to be a ceiling for the energy of the light source to be used; however, theoretically staying within the soft xrays, below ~1000 eV should induce photoemission without additional effects being seen. Lower energy light sources are easier to produce and more efficient than higher energy light sources. Exemplary light source energies utilized in one or more embodiments are a ~6 eV laser, a ~36 eV laser, and a ~70 eV beam.

The light source also needs to allow for tuning of its photon polarization. This tuning should allow for the photon polarization be linearly p-polarized, s-polarized, and ±sp-polarized, or circular right hand polarized and left hand polarized. This photon polarization tuning allows for the control of the spin-polarization of the emitted photoelectrons.

Once photoemission is induced, a strong dependence of the photoelectron spin polarization on the photon polarization of the laser results. This dependence enables the full manipulation of the photoelectron spin, which dramatically illustrates that spin-conservation, commonly assumed in for photoemission, is invalid in these materials. Park, C.-H. & Louie, S. G. Spin polarization of photoelectrons from topological insulators. *Phys. Rev. Lett.* 109, 097601(2012); herein incorporated by reference in its entirety. Embodiments of the invention are further specified by using specific photon polarization of the laser, where either linearly p-polarized, s-polarized, and ±sp-polarized, or circular right hand polarized and left hand polarized photon polarizations are used.

One preferred embodiment of the invented controllable spin-polarized electron source comprises a comprises the source of polarized incident light, however the incident light's photon polarization is tunable. This allows for the polarization to be linear or circular. The linear polarization can also be s-polarized, p-polarized, +sp-polarized, or −sp-polarized, while the circular polarization can be right hand circular or left hand circular. All of these different photon polarizations will result in different spin-polarizations of the surface electrons.

In addition to the tunable photon polarization of the incident light, the incident light can also be oriented as to hit the surface of the material at different angles. By inducing photoemission with incident light at different angles, emitted photoelectrons will have a different emission angle. Using linearly polarized light at any fixed orientation, photoelectron spin orientation depends on their momentum in the sample, and thus their angle of emission. For example, photoelectrons emitted at −5° from normal will have the opposite spin polarization from those emitted at +5°. This is important to note for the collection of photoemitted electrons. If an electron source is needed with a spin polarization along a specific direction, only electrons photoemitted along a particular emission angle from the material should be collected.

The figures show data of representative embodiments of the invention.

In FIG. 1, (a,b) show standard angle-resolved photoemission spectroscopy (ARPES) data collected from a $Bi_2Se_3$ single crystal using p-polarized linear incident light. (a) ARPES intensity map at $E_F$ of the (111) surface of $Bi_2Se_3$, with the ΓM direction aligned along $k_x$. The arrows show the expected spin polarization around the surface state Fermi surface. (b) ARPES intensity map as a function of binding energy and momentum. The sharp surface states form a cone-like dispersion in panel (b), characterized by the ring-like Fermi surface piece in panel (a). (c) Spin-resolved photoemission intensity as a function of binding energy, at fixed emission angle (~fixed k), corresponding to the dashed line-cut in (b), and the momentum location marked by the dashed circle in (a). The corresponding y component of the photoelectron polarization, $P_y$, is shown in the bottom panel. The Fermi surface diagram inset highlights the k-space location, (kx,ky)=(−kF,0), along with the spin-polarization direction indicated by the data. The data are acquired with p-polarized photons, with the photon polarization vector, projected into the sample surface plane, shown as a dashed arrow in the inset. (d) Same as (c), but with s-polarized photons. (e) Diagram of the experimental geometry. Linear polarization of photons can be continuously rotated as shown. Dashed gray line represents projection of incident light linear polarization on the sample surface. (f) Photoelectron spin polarization at (kx,ky)=(−kF,0) as a function of rotation of the photon polarization. Photoelectron polarization is integrated in binding energy corresponding to the gray regions of the bottom panels in (c) and (d).

Figure 2:
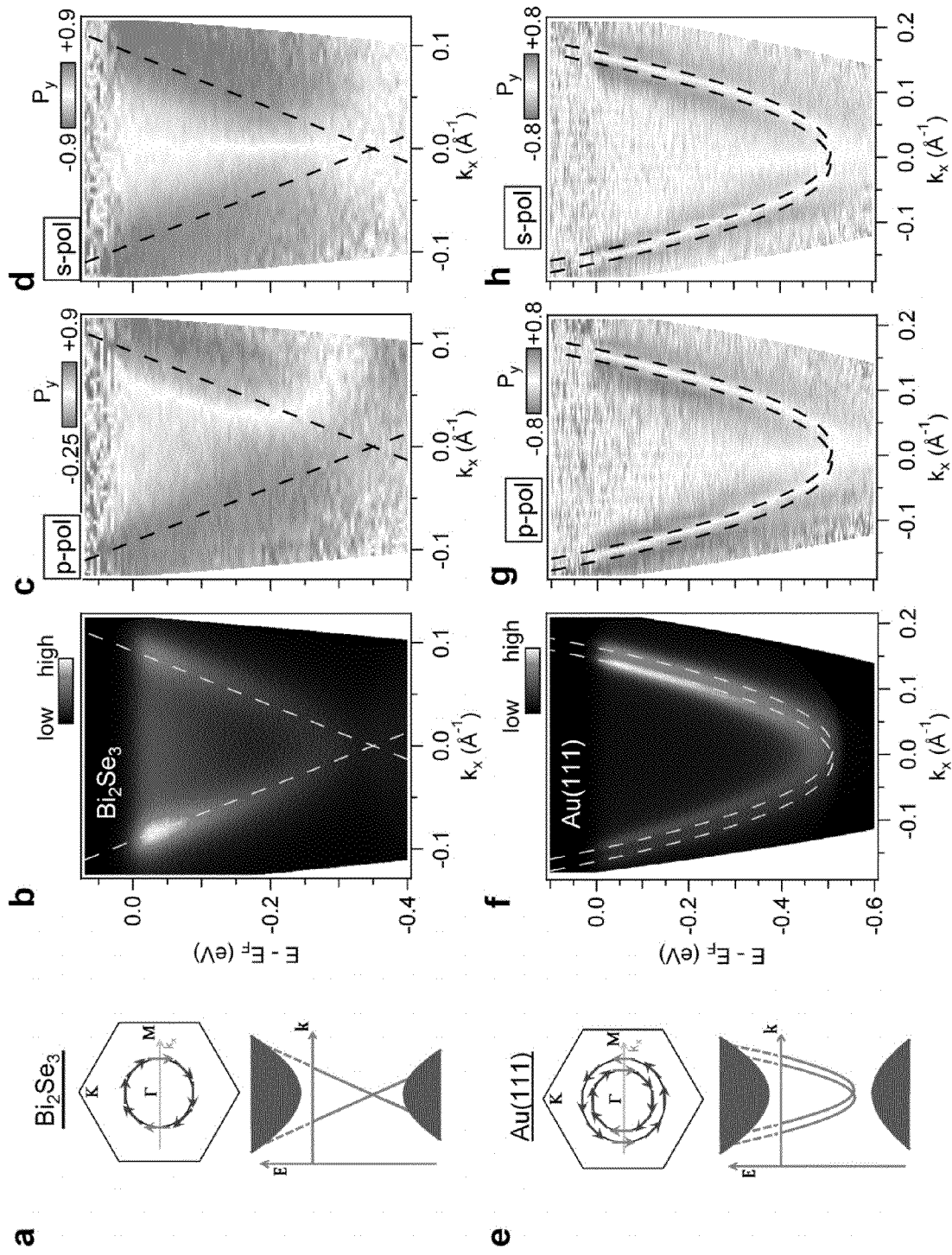
FIG. 2 Photoelectron spin flipping mapped through momentum space. (a,b,c,d) show the effects in $Bi_2Se_3$ surface states while (e,f,g,h) show the effects in Au(111) surface states.

FIG. 2 shows the difference between p- and s-polarized light (c,d) as well as $Bi_2Se_3$ and Au(111). The upper panels (a-d) represent $Bi_2Se_3$ while (e-h) represent the AU(111) surface state. (a) shows a schematic of surface state helical Dirac fermions in $Bi_2Se_3$, including Fermi surface (above) and energy dispersion along kx. (b) Spin-integrated ARPES intensity map of $Bi_2Se_2$, taken with laser, s-polarized, hv=5.99 eV. Dashed lines are linear guides to the eye illustrating Dirac cone dispersion of the surface state. (c,d) Corresponding spin polarization ($P_y$) maps taken with p- and s-polarized light, respectively, showing the difference between spin polarization is exactly the opposite for p- and s-polarized light. Dashed guides to the eye are identical to (b). The difference in spin polarization of $Bi_2Se_3$ emitted photoelectrons from p-polarized and s-polarized light is opposite to the expected surface state electron spin texture. (e-h) Same as a-d, but for the Au(111) surface state. Dashed lines in f-h are parabolic guides to the eye following the free-electron-like dispersions.

Figure 3:
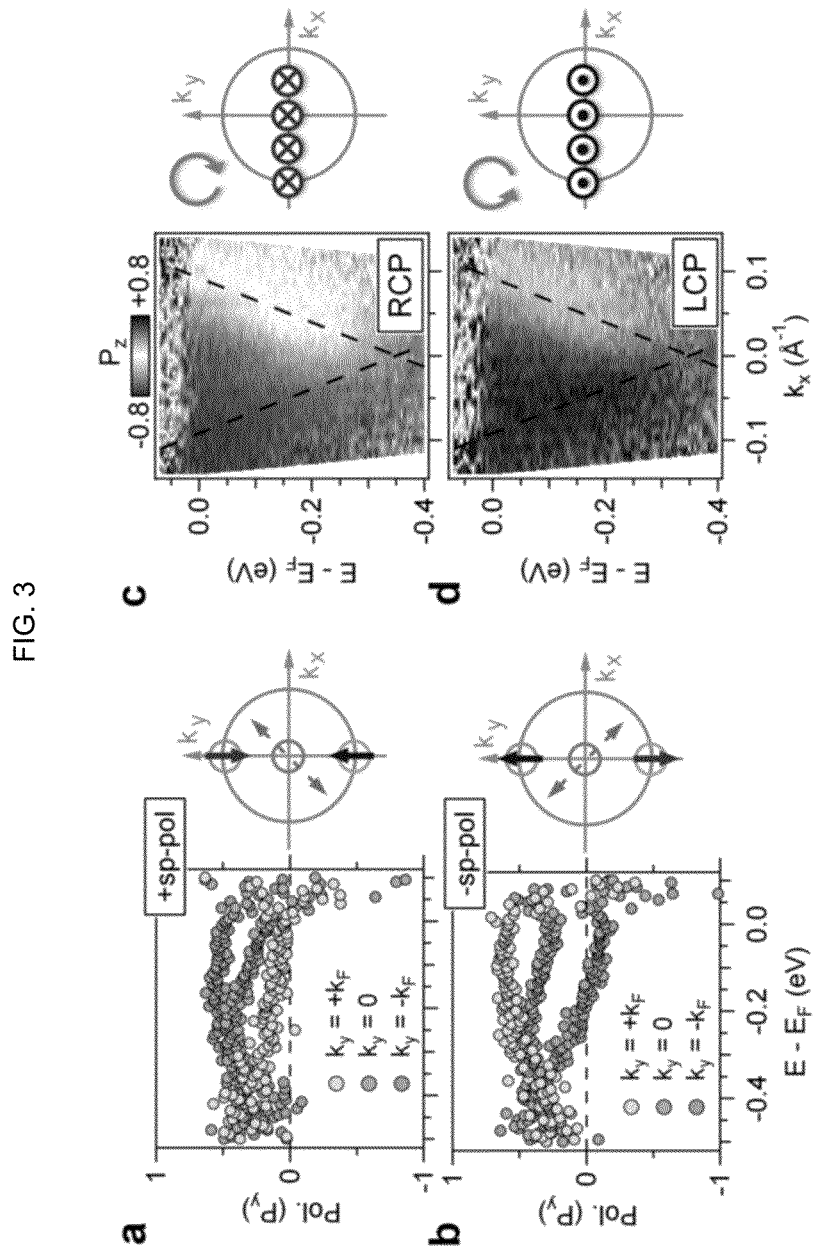
FIG. 3 $Bi_2Se_3$ photoelectron spin polarizations with ±sp-polarized and right/left hand circularly polarized light.

FIG. 3 shows the representative results using linear sp-polarized (a), −sp-polarized (b), right hand circularly polarized (c), and left hand circularly polarized (d) incident light. (a) Photoelectron $P_y$ curves at three values of ky along the ky-axis, for +sp-polarized light, whose ϵ projections in the surface plane are shown by the arrows in the insets. (b) Same as (a), but for −sp-polarized light. (c) Photoelectron $P_y$ maps as a function of binding energy and momentum along the kx axis, with right-hand circularly polarized light. The dashed lines are guides to the eye, marking the topological surface state dispersion. (d) Same as (c), but with left-hand circularly polarized light. The additional strong Ky dependence shown in FIG. 3 reveals the presence of a large radial component of the polarization, which was absent in previous measurements with p-polarized lights. Such a radial component of the photoelectron spin polarization differs from the expected surface state electron spin texture which is primarily tangential at every point around the Fermi surface contour.

Figure 4:
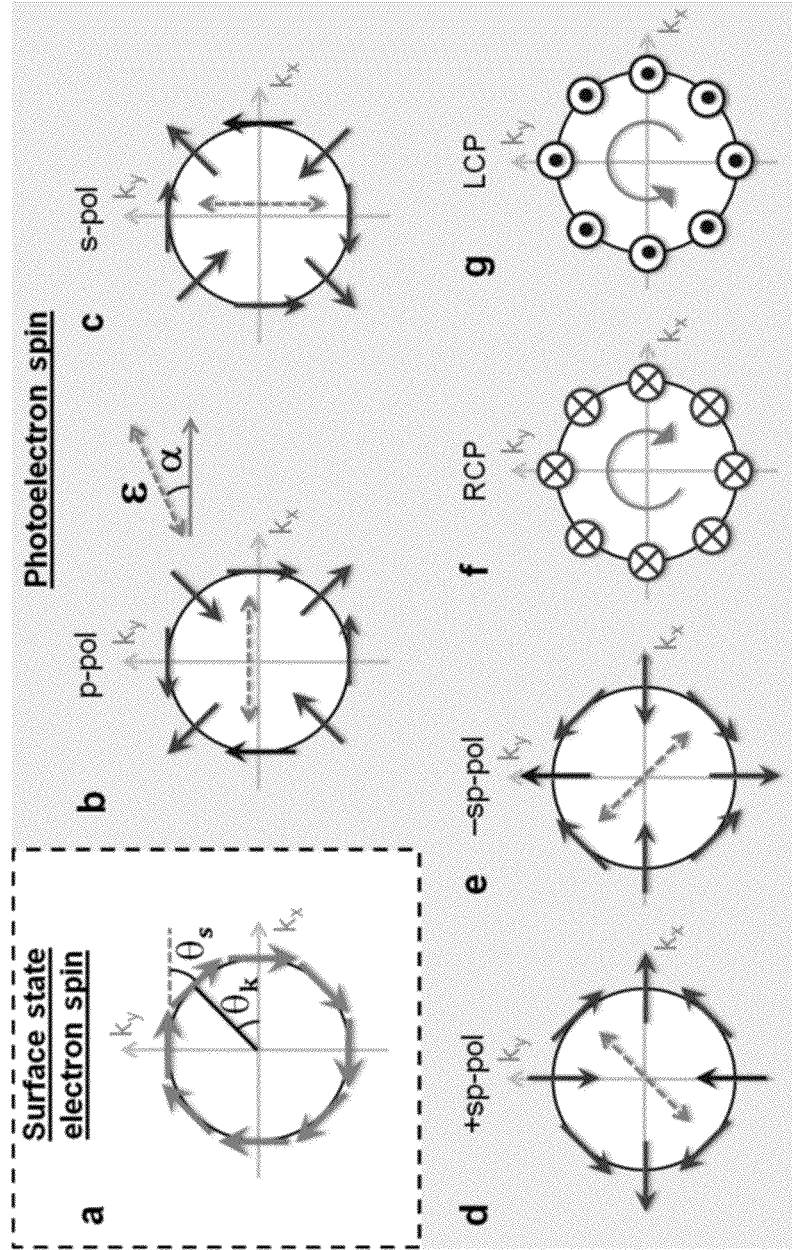
FIG. 4 Calculated photoelectron spin textures from a topological insulator for various photon polarizations.

FIG. 4 is representative of the calculated photoelectron spin textures of the two embodiments for various photon polarizations. (a) Spin texture of topological spin-helical Dirac electrons. Arrows depict spin of surface state electrons, prior to photoemission. (b-e) Calculated spin texture of photoelectrons from the same topological states, for various photon polarizations. Arrows depict the photoelectron spin polarization directions, using linearly polarized light. The dashed arrows mark the polarization vector, ϵ, projected onto the sample surface. These correspond to p-polarized (b), s-polarized (c), and ±sp-polarized light (d,e) in the current experiment. The blue and red arrows correspond to the momentum positions and polarization directions consistent with the experimental data. (f,g) Same as (b-e), but with normally incident circularly polarized photons where crosses and dots depict photoelectron polarization into and out of the page along the z-axis.

The data in FIGS. 1 and 2 illustrate that photoemission being dominated by a spin-flip process, an effect not previously experimentally observed. The results shown in FIGS. 1-3 reveal the ability to fully manipulate the spin polarization of photoelectrons from a topological insulator through control of the light polarization to an extent not previously observed in any system. These results also illustrate non-equivalence of photoelectron and surface state spins in a topological insulator, contrary to the usual assumption in spin-resolved photoemission studies. FIG. 4 shows calculated spin texture of photoelectrons and the corresponding spin dependent transition probabilities and they result in strong differences between predicted photoelectron spin polarization textures and the helical spin texture of the initial topological surface state. This capability of spin-flip transitions is counter to the usual assumption for such photoemission experiments.

Figure 5:
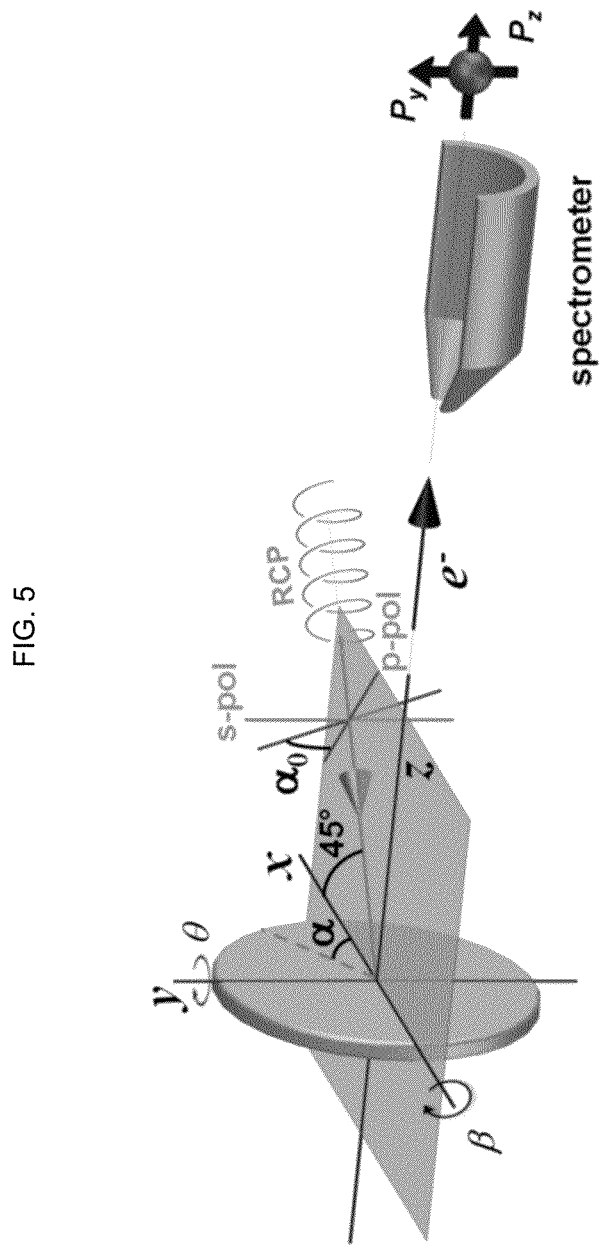
FIG. 5 Schematic diagram of the experimental geometry.

FIG. 5 shows a schematic diagram of the geometry of one or more embodiments. The x, y, and z axes reference a fixed coordinate system. The photon beam is incident within the xz-plane, at a fixed angle from the x axis. Photoelectrons emitted along the fixed z axis, shown by the black arrow, are collected by the spectrometer, which is sensitive to spin along the y and z axes. The photons can be linearly polarized with any orientation between p- and s-polarizations, defined by the angle $α_0$. The photons can also be circularly polarized, with either helicity. Here, right-hand circularly polarized light (RCP) is shown.

Figure 6:
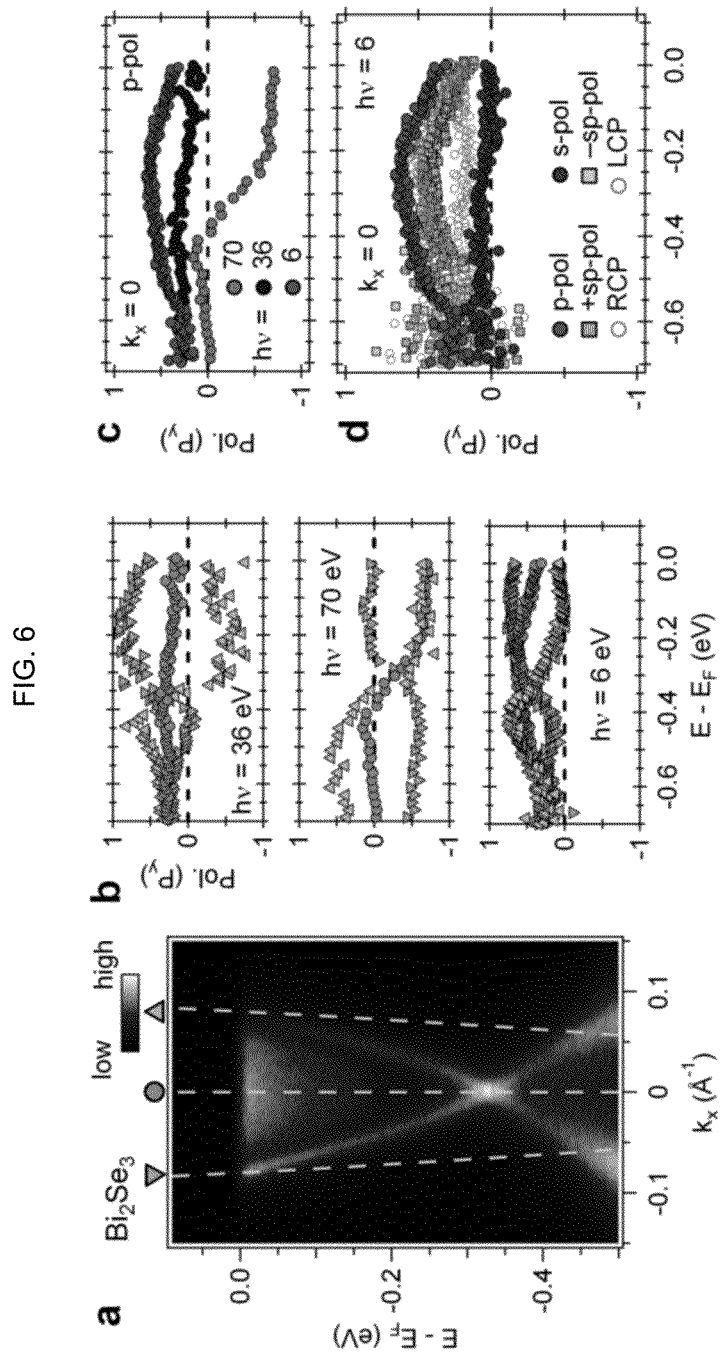
FIG. 6 Dependence of photoelectron background spin on photon energy and polarization.

FIG. 6 represents the dependence of photoelectron background spin on photon energy and polarization. (a) ARPES intensity map of $Bi_2Se_3$ as a function of binding energy and momentum, along ΓM. Taken with hv=35 eV, (b) The measured y component of the photoelectron spin polarization, $P_y$, as a function of binding energy at a given momentum. Each panel contains curves corresponding to the momenta of the vertical cuts shown in (a), labeled by marker. Each panel corresponds to data taken with the specified photon energy, taken with the p-polarized light geometry. (c) Direct comparison of the photoelectron $P_y$ at Γ (kx=0) from (b) at each photon energy. (d) The photoelectron $P_y$ at Γ, measured with the laser (hv=6 eV), with various photon polarizations.

Figure 7:
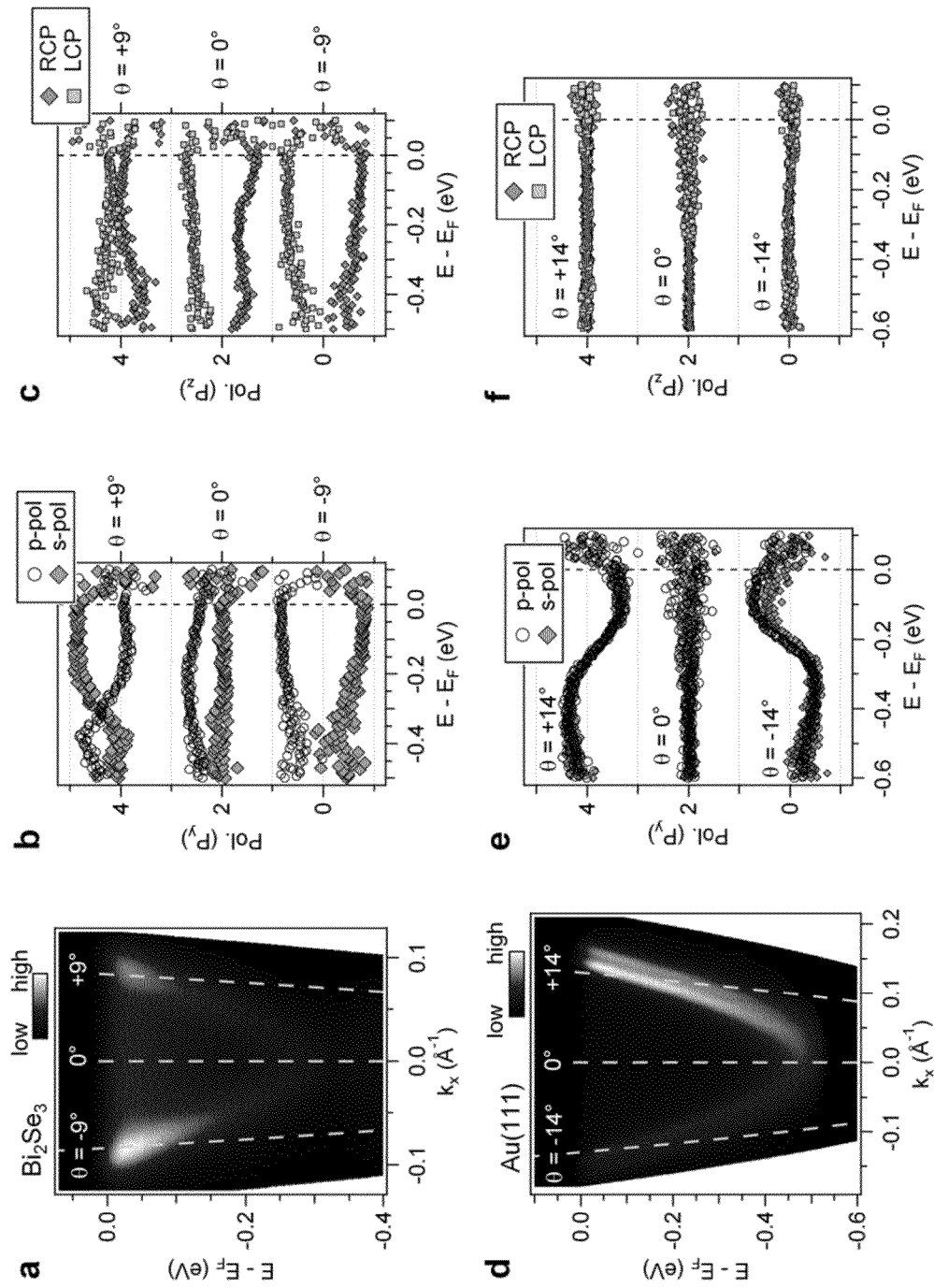
FIG. 7 Polarization dependence of photoelectron spin in $Bi_2Se_3$ and Au(111) surface states.

FIG. 7 shows a comparison of polarization dependence of photoelectron spin in $Bi_2Se_3$ and Au(111) surface states. (a) ARPES intensity map of $Bi_2Se_3$ as a function of binding energy and momentum, along ΓM, taken with hv=6 eV. (b) The y component of photoelectron spin polarization, $P_y$, as a function of binding energy at labeled emission angles, corresponding to the line cuts marked in (a). The $P_y$ curves at each emission angle are vertically offset by 2 for clarity. Corresponding $P_y$ curves measured with p- and s-polarized light are directly compared. (c) Same as (b), except the curves display the z component of photoelectron spin polarization, $P_z$, and are measured with both helicities of circular polarized light, (d-f) Same as (a-c) but measured from the Au(111) Shockley surface state.

One or more embodiments improve upon the current state of the art for producing spin-polarized electron sources. Topological insulators provide a number of benefits over gallium arsenide photocathodes. The topological insulators have quite robust protected surface states, meaning that they cannot be destroyed by impurities or small imperfections that can affect GaAs photocathodes. The surfaces of topological insulators are easier to prepare than those of GaAs photocathodes in that simply cleaving a crystal in vacuum provides a very clean surface where the needed properties exist. With GaAs photocathode, the photon energy must be at least ~1.48 eV in order to excite electrons from the valence band to the conduction band. If the photon energy is higher than 1.5 eV, the spin polarization of the emitted photoelectrons is lost. With topological insulators, there is no need for ex-situ etching or in-situ heating and the complicated and delicate surface coating of Cs and $O_2$ is not required because a higher photon energy incident light can be used while still getting the spin polarization of the emitted photoelectrons.

Another benefit of one or more embodiments over the prior art is that the polarization values are quite high. Without any complex strained superlattice wafer engineering, electrons photoemitted from $Bi_2Se_3$ have spin polarizations of 80%, much higher than the plain GaAs photocathode.

A third benefit of one or more embodiments over the prior art is that the electrons photoemitted from topological insulators are fully controllable in three dimensions by the photon polarization used in the incident light. Like GaAs photocathodes, when the incident light is circularly polarized, the emitted electrons are spin polarized along the photon beam, but with higher spin polarizations. However, unlike GaAs photocathodes, topological insulators emit electrons spin polarized parallel to the surface plane when the incident light is linearly polarized. Further, the spin orientation within this plane is completely controlled by the orientation of the incident light's linear polarization. Manipulation of the photoelectrons is much easier in topological insulators as the photoelectrons can be controlled in three dimensions with simple photon polarization control. GaAs photocathodes post-emission electromagnetic manipulation of the emitted photoelectrons requires electrostatic optics or magnetic elements that steer the electron beam's direction, but must do so without affecting the polarization, a task not easily accomplished.

Having described the basic concept of the invention, it will be apparent to those skilled in the art that the foregoing detailed disclosure is intended to be presented by way of example. Various alterations, improvements, and modifications are intended to be suggested and are within the scope and spirit of the present invention. Additionally, the recited order of the elements or sequences, or the use of numbers, letters or other designations therefor, is not intended to limit the claimed processes to any order except as may be specified. All ranges disclosed herein also encompass any and all possible sub-ranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as up to, at least, greater than, less than, and the like refer to ranges which can be subsequently broken down into sub-ranges as discussed above. Accordingly, the invention is limited only by the following claims and equivalents thereto. All publications and patent documents cited in this application are incorporated by reference in their entirety for all purposes to the same extent as if each individual publication or patent document were so individually denoted.

We claim:

1. A method of creating a controllable spin-polarized electron source comprising the following steps:
   a. providing one or more materials, the one or more materials having at least one surface and a material layer adjacent to said surface, wherein said surface comprises highly spin polarized surface electrons, wherein the direction and spin of the surface electrons are locked together;
   b. providing at least one incident light capable of stimulating photoemission of said surface electrons: wherein the incident light has a photon energy above the work function of said materials; wherein the photon polarization of incident light is tunable; wherein the different polarization and orientation of the incident light result in different polarization of said surface electrons; and
   c. inducing photoemission of the surface electron states.

2. The method of claim 1, wherein the photon polarization is linearly polarized light.

3. The method of claim 1, wherein the photon polarization is normally incident circularly polarized photons.

4. The method of claim 1, wherein said linear polarization of the light is rotated about the light propagation axis up to 360°.

5. The method of claim 4, wherein the photon polarization is p-polarized resulting in an intensity peak of photoelectrons of a defined polarization determined by the angle of emission.

6. The method of claim 4, wherein the photon polarization is s-polarized resulting in an intensity peak of photoelectrons of a defined polarization determined by the angle of emission; wherein the defined polarization is opposite to an intensity peak from p-polarized photon polarization at the same angle of emission.

7. The method of claim 4, wherein the photon polarization vector is rotated to +45° or halfway between p- and s-polarizations.

8. The method of claim 4, wherein the photon polarization vector is rotated to −45° resulting in photoelectron spin polarization.

9. The method of claim 5, wherein the circularly polarized photon source is right-hand circularly polarized light; wherein when the right-hand circularly polarized light is incident along the surface normal resulting in spins directed into the surface plane of the material perpendicularly and a negative polarization.

10. The method of claim 5, wherein the circularly polarized photon source is left-hand circularly polarized light; wherein when the left-hand circularly polarized light is incident along the surface normal resulting in spins directed away from the surface plane of the material perpendicularly and a positive polarization.

11. The method of claim 4, wherein step of collecting said emitted photoelectrons is done by way of an electron extractor at a given emission angle.

12. The method of claim 11, wherein said linearly polarized light is at a fixed orientation.

13. The method of claim 12, wherein said emitted photoelectrons perfectly perpendicular to the surface is defined as zero degrees (0°); said photoelectrons emitted at 0° have zero spin polarization; the emitted photoelectrons collected by said extractor are at an emission polar angle other than 0°; wherein said emission polar angle of surface state extends from greater than 0° to 90°; wherein said emission azimuthal angles can vary from 0° to 360°; and photoelectrons emitted along opposite azimuthal angles separated by 180° have opposite spin polarizations.

14. The method of creating a controllable spin-polarized electron source of claim 1, wherein:
   a. said one or more materials is selected from the group of three-dimensional topological insulators including, but not limited to: bismuth antimonide, antimony, bismuth selenide, bismuth telluride, antimony telluride, samarium hexaboride, and stanene;
   b. wherein the photon polarization is linearly polarized light.

15. The method of claim 14, wherein said linear polarization of the light is rotated about the light propagation axis up to 180°.

16. The method of claim 14, wherein the photon polarization is p-polarized resulting in an intensity peak of photoelectrons of a defined polarization determined by the angle of emission.

17. The method of claim 14, wherein the photon polarization is s-polarized resulting in an intensity peak of photoelectrons of a defined polarization determined by the angle of emission; wherein the defined, polarization is opposite to an intensity peak from p-polarized photon polarization at the same angle of emission.

18. The method of claim 14, wherein the photon polarization vector is rotated to +45° or halfway between p- and s-polarizations.

19. The method of claim 14, wherein the photon polarization vector is rotated to −45° resulting in photoelectron spin polarization.

20. The method of creating a controllable spin-polarized electron source of claim 1, wherein:
   a. said one or more materials is selected from the group of three-dimensional topological insulators including, but not limited to: bismuth antimonide, antimony, bismuth selenide, bismuth telluride, antimony telluride, samarium hexaboride, and stanene;
   b. wherein the photon polarization is normally incident circularly polarized photons.

21. The method of claim 20, wherein the circularly polarized photon source is right-hand circularly polarized light; wherein when the right-hand circularly polarized light is incident along the surface normal resulting in spins directed into the surface plane of the material perpendicularly and a negative polarization.

22. The method of claim 20, wherein the circularly polarized photon source is left-hand circularly polarized light; wherein when the right-hand circularly polarized light is incident along the surface normal resulting in spins directed into the surface plane of the material perpendicularly and a negative polarization.

23. The method of claim 14, comprising a step of collecting said emitted photoelectrons carried out by way of an electron extractor at a given emission angle.

24. The method of claim 23, wherein said linearly polarized light is at a fixed orientation.

25. The method of claim 24, wherein said emitted photoelectrons perfectly perpendicular to the surface is defined as zero degrees (0°); said photoelectrons emitted at 0° have zero spin polarization; the emitted photoelectrons collected by said extractor are at an emission polar angle other than 0°; wherein said emission polar angle of surface state extends from greater than 0° to 90°; wherein said emission azimuthal angles can vary from 0 to 360°; and photoelectrons emitted along opposite azimuthal angles separated by 180° have opposite spin polarizations.

* * * * *